United States Patent
Brady

(10) Patent No.: US 7,879,638 B2
(45) Date of Patent: Feb. 1, 2011

(54) BACKSIDE ILLUMINATED IMAGER AND METHOD OF FABRICATING THE SAME

(75) Inventor: Frederick Brady, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 657 days.

(21) Appl. No.: 11/712,996

(22) Filed: Mar. 2, 2007

(65) Prior Publication Data

US 2008/0211939 A1 Sep. 4, 2008

(51) Int. Cl.
H01L 21/00 (2006.01)
(52) U.S. Cl. .............................. 438/66; 438/67; 438/70; 257/E21.575
(58) Field of Classification Search .................. 438/66, 438/67, 70; 257/E21.575
See application file for complete search history.

(56) References Cited

U.S. PATENT DOCUMENTS

| | | | |
|---|---|---|---|
| 6,908,839 B2 * | 6/2005 | Rhodes | 438/595 |
| 7,619,266 B2 * | 11/2009 | Mouli | 257/291 |
| 2003/0164522 A1 * | 9/2003 | Kato et al. | 257/359 |
| 2004/0222358 A1 | 11/2004 | Bui et al. | |
| 2005/0045926 A1 * | 3/2005 | Mouli | 257/294 |
| 2005/0059177 A1 * | 3/2005 | Rhodes | 438/22 |
| 2006/0197007 A1 | 9/2006 | Iwabuchi et al. | |
| 2007/0040176 A1 * | 2/2007 | Kato et al. | 257/66 |
| 2007/0108476 A1 * | 5/2007 | Hong | 257/225 |
| 2007/0246756 A1 * | 10/2007 | Mouli | 257/292 |
| 2007/0284686 A1 * | 12/2007 | Liu et al. | 257/432 |
| 2007/0296004 A1 * | 12/2007 | Mouli | 257/291 |
| 2008/0268611 A1 * | 10/2008 | Li et al. | 438/431 |

FOREIGN PATENT DOCUMENTS

WO WO-2006/131209 12/2006

\* cited by examiner

*Primary Examiner*—Ngan Ngo

(57) ABSTRACT

A structure and method for fabricating imagers that detect light from the backside of the wafer. The structure may have less complex focusing, reduced crosstalk, tighter pixel packing density, increased quantum efficiency, and wafer-level packaging. The fabrication of the imager includes forming an imaging device on a silicon wafer, adhering an interconnect wafer to the device wafer, forming interconnects on the interconnect wafer, etching away the substrate of the device wafer, and patterning additional layers such as nitrides, color filter arrays, and lenses on the backside of the device wafer.

31 Claims, 8 Drawing Sheets

BACKSIDE ILLUMINATED IMAGER AND METHOD OF FABRICATING THE SAME

FIELD OF THE INVENTION

Embodiments of the invention relate generally to solid state imaging devices and, more particularly, to a method of making an imaging structure that detects light from the backside of its associated semiconductor substrate.

BACKGROUND OF THE INVENTION

A CMOS imager includes a focal plane array of pixels, each pixel including a photosensor, for example, a photogate, photoconductor or a photodiode overlying a substrate for producing a photo-generated charge in a doped region of the substrate. A readout circuit is provided for each pixel and includes at least a source follower transistor and optionally, a row select transistor for coupling the source follower transistor to a column output line. The pixel also typically has a floating diffusion region, connected to the gate of the source follower transistor. Charge generated by the photosensor is sent to the floating diffusion region. The imager may also include a transistor for transferring charge from the photosensor to the floating diffusion region and another transistor for resetting the floating diffusion region to a predetermined charge level prior to charge transference.

In a CMOS imager, the active elements of a pixel, for example a four transistor pixel, perform the necessary functions of (1) photon to charge conversion; (2) transfer of charge to the floating diffusion region; (3) resetting the floating diffusion region to a known state before the transfer of charge to it; (4) selection of a pixel for readout; and (5) output and amplification of a signal representing a reset voltage and a pixel signal voltage based on the photo converted charges. The charge at the floating diffusion region is converted to a pixel output voltage by a source follower output transistor.

A schematic diagram of a conventional CMOS four-transistor (4T) pixel 20 is illustrated in FIG. 1. The four transistors include a transfer transistor 22, a reset transistor 23, a source follower transistor 24, and a row select transistor 25. A photosensor 21, e.g., a pinned photodiode, converts incident light into charge. A floating diffusion region 26 receives charge from the photosensor 21 through the transfer transistor 22 (when activated) and is also connected to the reset transistor 23 and the gate of the source follower transistor 24. The source follower transistor 24 outputs a signal proportional to the charge accumulated in the floating diffusion region 26 to a sampling circuit when the row select transistor 25 is turned on. The reset transistor 23 resets the floating diffusion region 26 to a known potential prior to transfer of charge from the photosensor 21. The photosensor 21 may be a photodiode (as shown in FIG. 1), a photogate, or a photoconductor. If a photodiode is employed, the photodiode may be formed below a surface of the substrate and may be a p-n-p photodiode, an n-p-n photodiode, a p-n photodiode, or a n-p photodiode, among others.

CMOS semiconductor imaging devices include an array of pixels such as pixel 20 of FIG. 1, which convert light energy received, through optical lenses, into electrical signals. The electrical signals produced by the array of pixels are processed to render a digital image.

The amount of charge generated by the photosensor 21 corresponds to the intensity of light impinging on the photosensor 21, for a given integration time. Accordingly, it is important that all of the light directed to the photosensor 21 impinges on the photosensor 21 rather than being reflected or refracted toward another photosensor (known as optical crosstalk).

For example, optical crosstalk may exist between neighboring photosensors in a pixel array. In an ideal imager, light enters only through the surface of the photosensor that directly receives the light stimulus. In reality, however, some light intended for one photosensor also impinges on another photosensor through the sides of the optical path existing between a lens and the photosensor.

Optical crosstalk can bring about undesirable results in the images produced by the imager. The undesirable results can become more pronounced as the density of pixels in the imager array increases, and as pixel size correspondingly decreases. The shrinking pixel sizes and greater pixel density make it increasingly difficult to properly focus incoming light on the photosensor of each pixel without accompanying optical crosstalk.

Optical crosstalk can cause a blurring or reduction in contrast in images produced by the imager. Optical crosstalk also degrades the spatial resolution, reduces overall sensitivity, causes color mixing, and leads to image noise after color correction. As noted above, image degradation can become more pronounced as pixel and related device sizes are reduced. Furthermore, degradation caused by optical crosstalk is more conspicuous at longer wavelengths of light. Light having longer wavelengths penetrates more deeply into the silicon structure of a pixel, providing more opportunities for the light to be reflected or refracted away from its intended target photosensor.

Electrical crosstalk may also occur when the photogenerated signals migrate through the silicon between pixels, and are collected at the wrong photodiode. Electrical crosstalk becomes more pronounced as pixel size decreases, and for longer wavelength light.

FIG. 2 illustrates the problem of optical and electrical crosstalk in a conventional frontside illuminated imager. A conventional frontside illuminated imager includes an array of pixels. For simplicity, a cross section of a single pixel 2 is illustrated. Pixel 2 has, for example, photodiodes, formed within a substrate 41. FIG. 2 also illustrates a metallization and interlayer dielectric layer 51 in contact with the substrate 41. A nitride layer 91, color filter array layer 96, and microlens 97 are also provided. Ideally, incoming light 13 should stay within a photosensor optical path 12 when traveling through a microlens 97 to a respective photosensor of the pixel 2. However, light 13 can be reflected within the respective layers of the imager and at the junctions between these layers. The incoming light 13 can also enter the pixel at different angles, causing the light to be incident on a different photosensor. Loss of the incident light 13 as it travels through the various layers also decreases the quantum efficiency of the device.

As noted, electrical crosstalk may also occur between pixels when photogenerated electrons migrate through the silicon layers. The thicker the silicon layers are, the greater space and opportunity for such migration to occur. However, thicker silicon layers provide greater overall structural stability to a device containing a pixel array.

Accordingly, there is a need and desire for an improved apparatus and method for reducing crosstalk and related electrical interference in imaging devices, without compromising structural stability. There is also a need to more effectively and accurately increase overall pixel sensitivity and provide improved crosstalk immunity without adding complexity to the manufacturing process and/or increasing fabrication costs. There is also a need to increase quantum efficiency. It would further be beneficial to provide an imager device having wafer level packaging.

DETAILED DESCRIPTION OF THE INVENTION

In the following detailed description, reference is made to the accompanying drawings which form a part hereof, and in which is shown by way of illustration a specific embodiment of the invention. These embodiments are described in sufficient detail to enable those skilled in the art to practice them, and it is to be understood that other embodiments may be utilized, and that structural, logical and electrical changes may be made.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager pixel array will proceed simultaneously in a similar fashion.

Figure 3:
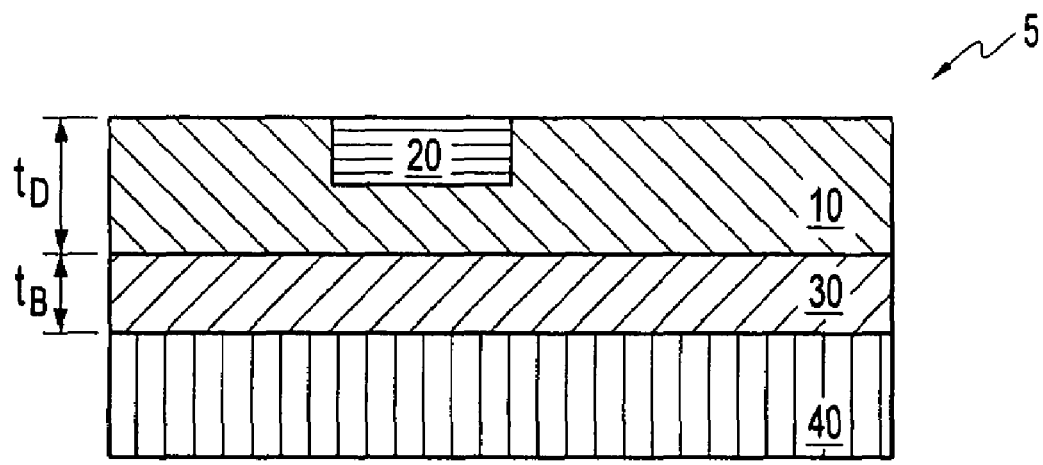
FIG. 3 is a cross-section of a portion of an embodiment of a pixel array in an initial stage of fabrication.

Referring now to the drawings, where like elements are designated by like reference numerals, FIG. 3 illustrates a cross-section of a portion of an embodiment of a pixel array in an initial stage of fabrication. A stack 5 is formed which comprises a device layer 10, a buried oxide layer 30 and a substrate layer 40. The device layer 10 has an imaging pixel 20 having a photodiode formed on one side. The device layer 10 may be a silicon layer. The pixel 20 may comprise a photodiode and associated transistors, but are represented herein as pixel 20, for simplicity of illustration. The device layer 10 may have a thickness, tD, of at least 2.0 μm, depending on the desired sensitivity to red or infrared light. The thinner the device layer 10 is, the less sensitive the pixel 20 will be to red or infrared light.

On the opposite side of the device layer 10, the buried oxide layer 30 is provided. The buried oxide layer 30 provides insulative properties to prevent crosstalk of photogenerated electrons from migrating laterally and prevent impurities from migrating into the device layer 10. The buried oxide layer 30 may have a thickness, tB, in the range of about 0.5 μm to about 2.0 μm, depending on the desired quantum efficiency. The thinner the buried oxide layer 30, the greater the quantum efficiency.

Additionally, the device layer 10 may have graded doping, with a higher doping being near the buried oxide layer 30 interface. Graded doping may provide additional insulative properties against crosstalk. Furthermore, the device layer 10 may have an n-type or p-type doping, though a p-type doping is more likely when n-channel transistors are used in pixel 20.

On the other side of the buried oxide layer 30, the substrate layer 40 is provided. The substrate layer 40 may have any thickness and provides structural stability to the device layer 10 during initial stages of processing, including the formation of the pixel 20 circuitry and peripheral circuitry associated with a pixel array. One or more passivation layers, e.g. BPSG, may be provided over the pixel 20 circuitry to protect the pixel 20 circuitry.

Figure 4:
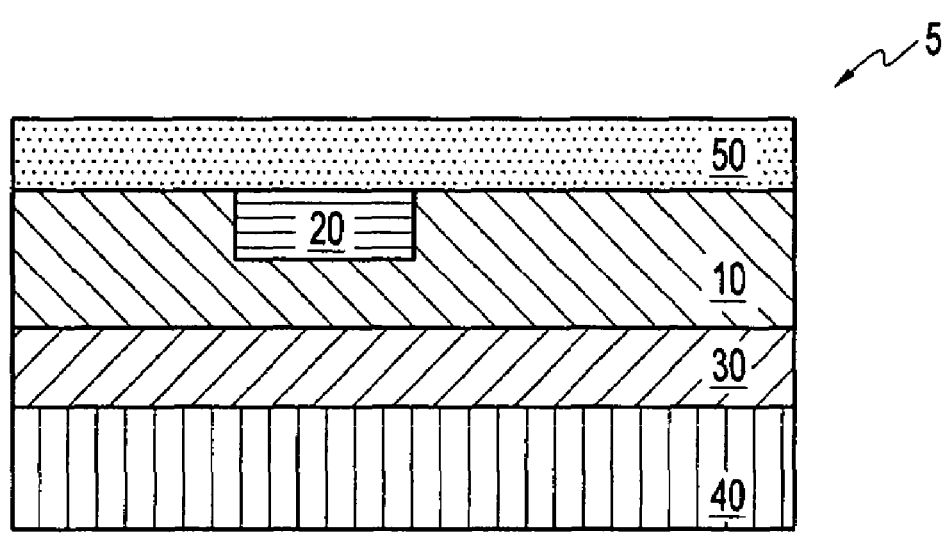
FIG. 4 is a cross-section of the embodiment of FIG. 3 in a subsequent stage of fabrication.

Metallization and interlayer dielectric layers, represented collectively as ILD layer 50, are provided over the device layer 10, as shown in FIG. 4. Optionally, an additional epitaxial layer may be formed between the device layer 10 and the ILD layer 50, in which the transistors for the pixel 20 may be formed. Such a structure would have greater fill factor since the footprint of the photodiode could be greater since the remaining pixel circuitry is in a different semiconductor layer.

Figure 5:
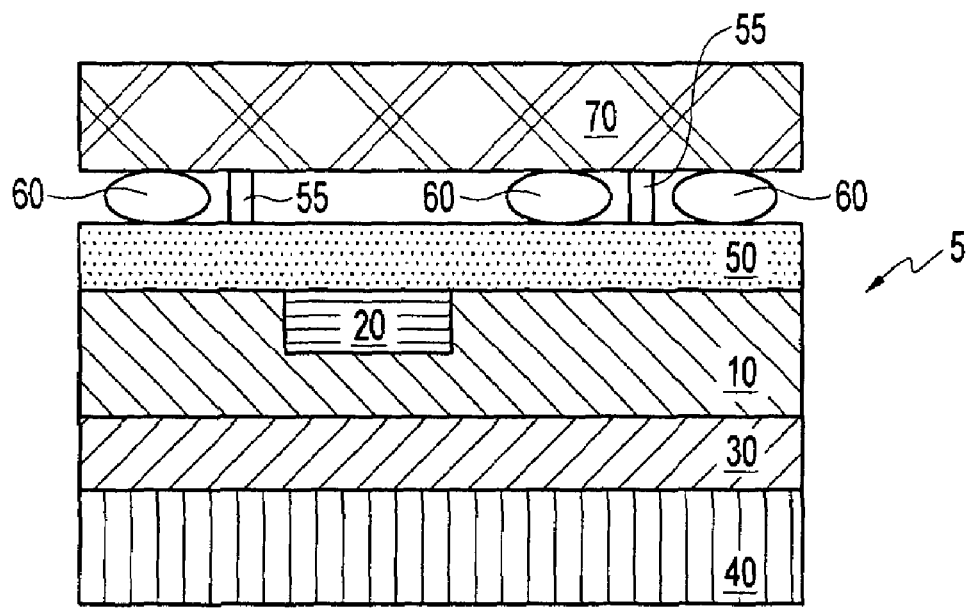
FIG. 5 is a cross-section of the embodiment of FIG. 4 in a subsequent stage of fabrication.

The ILD layer 50 has a final metal layer containing metal bond pads 55, that will connect to an interconnect wafer 70, as shown in FIG. 5. The interconnect wafer 70 is adhered to the ILD layer 50. In one embodiment, the interconnect wafer 70 may be adhered to the IDL layer 50 by bonding with an adhesive layer 60 such as epoxy.

The interconnect wafer 70 will provide structural support to the device layer 10 once the substrate layer 40 is etched away in subsequent steps, as described below. The interconnect wafer 70 also provides electrical signal paths into and out of the pixel array containing pixels 20 and peripheral circuitry associated with the array. The interconnect wafer 70 may also help provide a sealant between the device layer 10 and the outside environment, in the case of wafer level packaging, where a wafer contains an array of fabricated devices, each imager containing an array of pixels 20 and associated peripheral circuitry is bonded to a wafer having an interconnect wafer 70 extending over the device wafer. The interconnect wafer 70 may be made of silicon, or glass of another material. The interconnect wafer 70 may be unprocessed prior to bonding to the device layer 10. However, the interconnect wafer 70 may be patterned prior to bonding with the device layer 10, although this method requires additional alignment prior to bonding, as will be described below.

The adhesive, or epoxy, layer 60, may be screen printed. Other methods for providing the adhesive layer 60 include anodic bonding, low temperature silicon bonding, or eutectic bonding. If the interconnect wafer 70 is patterned with conductors and external connections prior to bonding, the interconnect wafer 70 and device layer 10 must be aligned to ensure that the bond pads 55 are bonded to the corresponding electrical connection on the interconnect wafer 70. The bonding may be followed by a cure to improve the bond strength and reduce outgassing during subsequent wafer processing steps.

Figure 6:
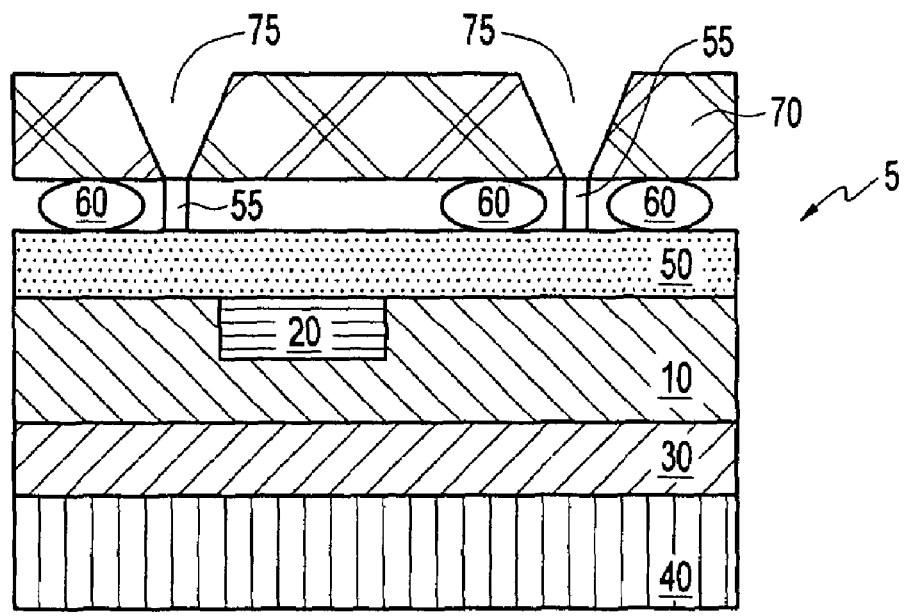
FIG. 6 is a cross-section of the embodiment of FIG. 5 in a subsequent stage of fabrication.

As shown in FIG. 6, the interconnect wafer 70 is patterned to have via openings 75. The patterning may be performed by anisotropic etch or by a laser ablation. The openings 75 are placed over the metal bond pads 55, and the etch or laser patterning process stops on the metal bond pads 55.

Figure 7:
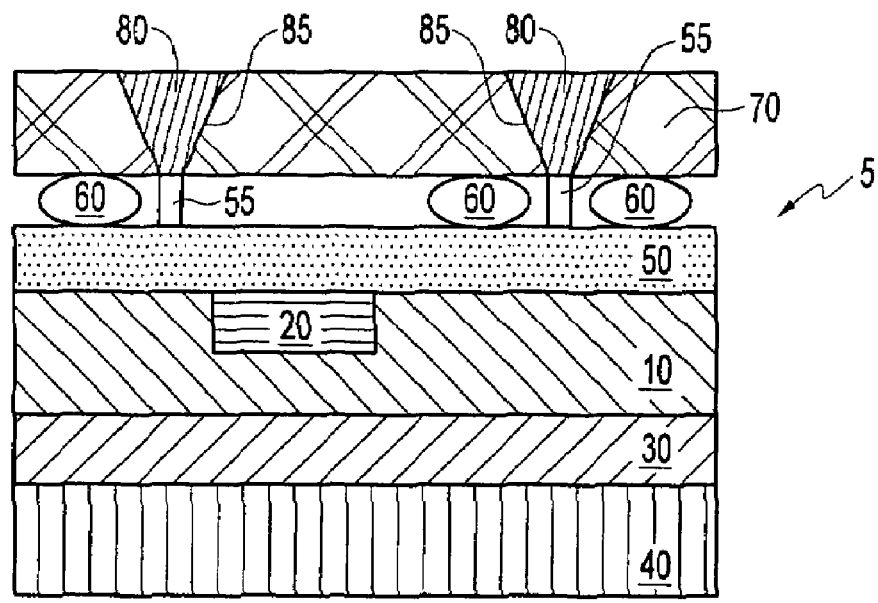
FIG. 7 is a cross-section of the embodiment of FIG. 6 in a subsequent stage of fabrication.

As shown in FIG. 7, the openings 75 are lined with a barrier metal 85 and filled with a metal plug 80. Excess metal on the top of the interconnect wafer may then be polished away.

Figure 8:
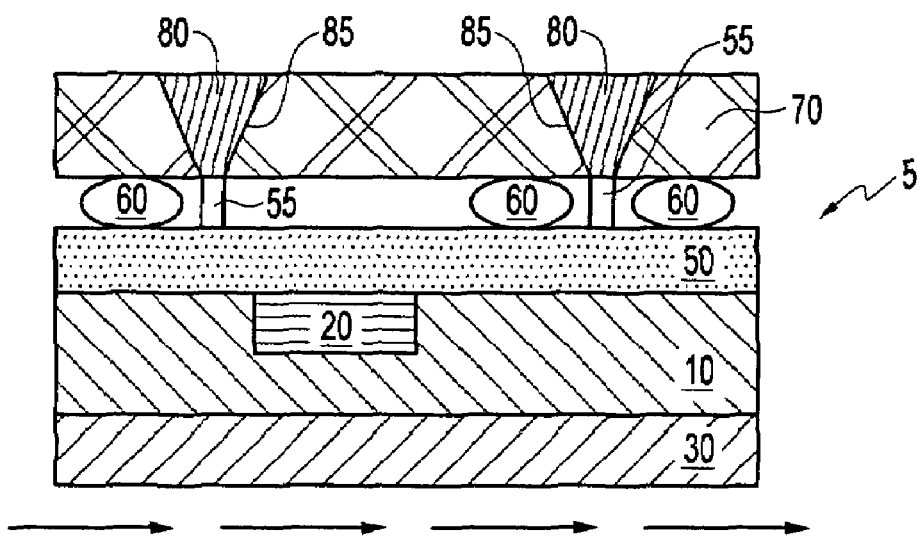
FIG. 8 is a cross-section of the embodiment of FIG. 7 in a subsequent stage of fabrication.

Once the processing of the interconnect wafer 70 is complete, the substrate layer 40 may then be etched away, as shown in FIG. 8. Substantially all of the substrate layer 40 may be etched away, since it is no longer needed to provided structural stability to the stack 5 with the interconnect wafer 70 in place. The substrate layer 40 may be etched away with an isotropic dry etch using, for example, $SF_6$ or $XeF_2$. Alternatively, the substrate layer 40 may be etched away using known wet isoptroic etches. When this etch is performed, the sides of a wafer containing stack 5 and the top of the wafer containing the interconnect wafer 70 should be protected.

By removing the substrate layer 40, the photodiode of pixel 20 will be placed closer to the source of incident light. Hence, requirements for focusing structures may be reduced. A microlens may not need to be precisely formed or may not be need at all.

Figure 9:
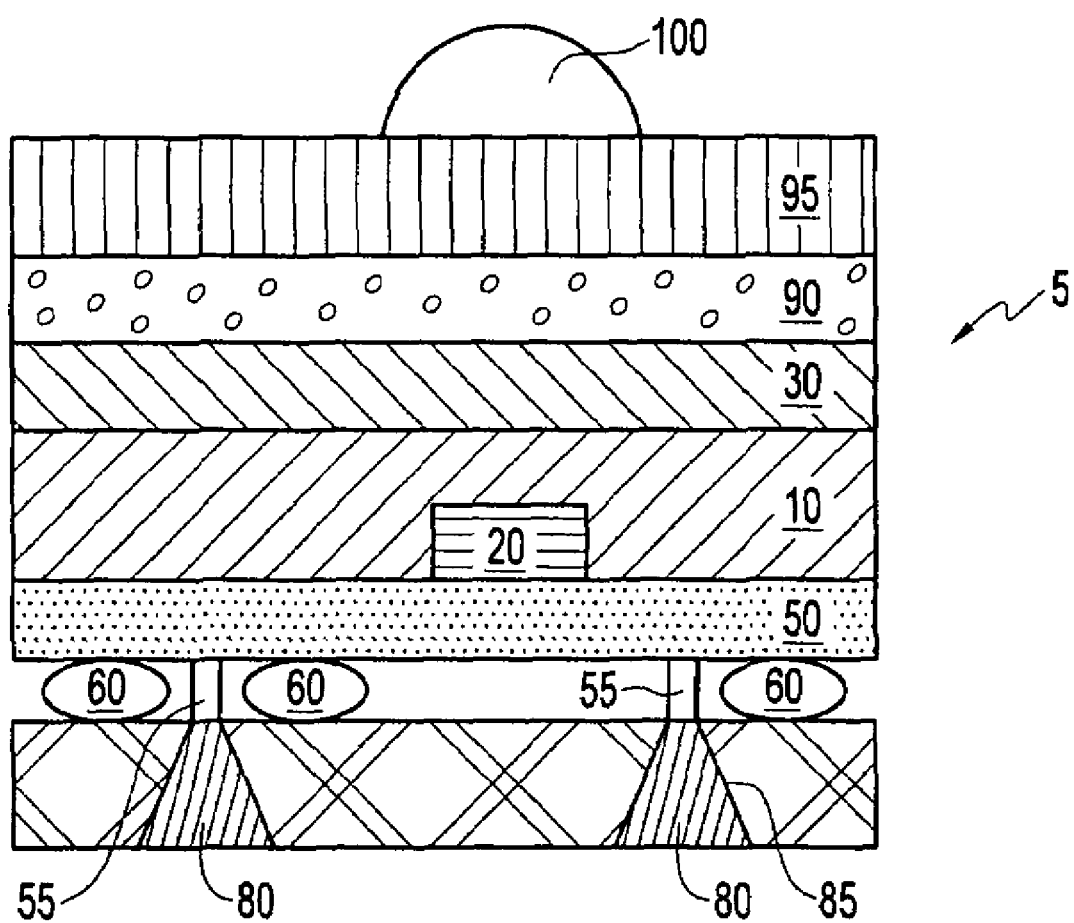
FIG. 9 is a cross-section of the embodiment of FIG. 8 in a subsequent stage of fabrication.

The stack 5 is then processed on the back side, as shown in FIG. 9, which shows the buried oxide layer 30 on top. A low temperature nitride layer 90 can be deposited to improve optical performance. A color filter array layer 95 may be provided over the nitride layer 90 and a microlens 100 layer may be formed over the color filter array layer 95. The color filter layer 95 may include red, green, and blue filters in a Bayer pattern, or other filter colors and patterns known in the art. It should be noted that although the embodiment has been described as having a single nitride layer 90, color filter array layer 95 and microlens 100 layer, the embodiments of the invention are not limited to having all of these layers and, optionally, one or more of these layers may be omitted, or other layers may be added. For example, a hardcoat may be provided over the microlens 100 layer to protect against reflow during subsequent development processes.

Figure 1:
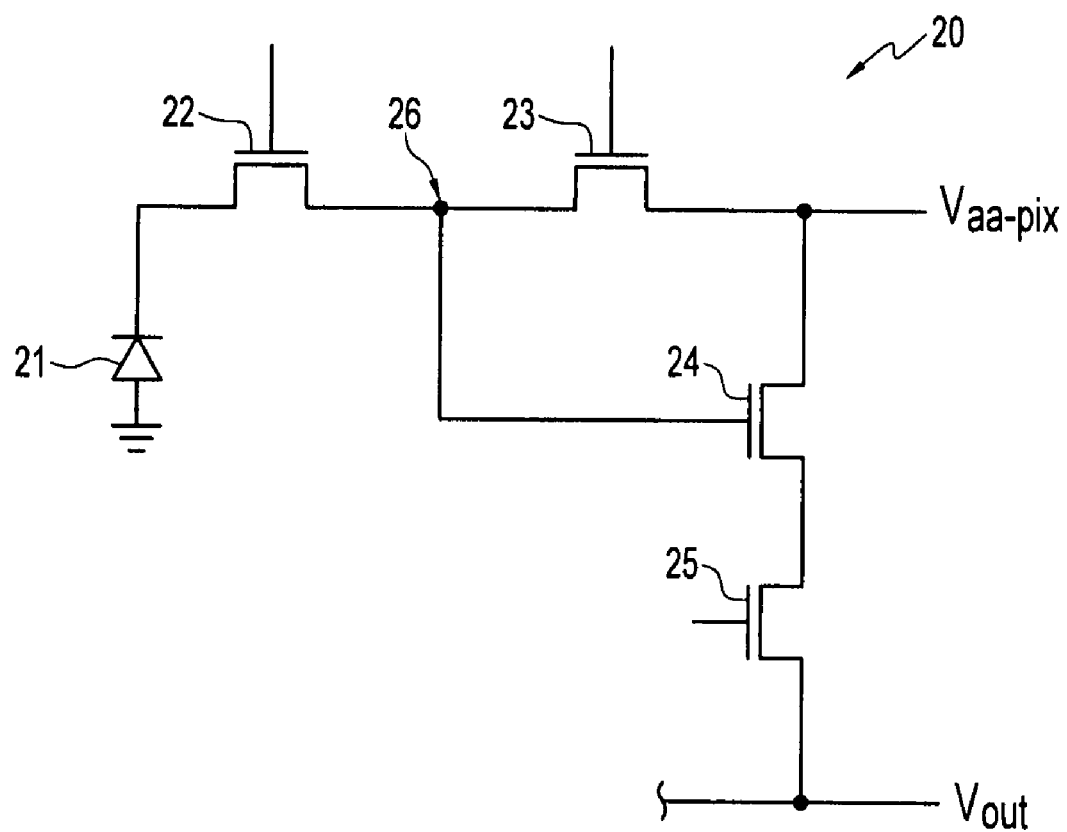
FIG. 1 is a schematic diagram of a conventional CMOS four-transistor (4T) pixel.
Figure 2:
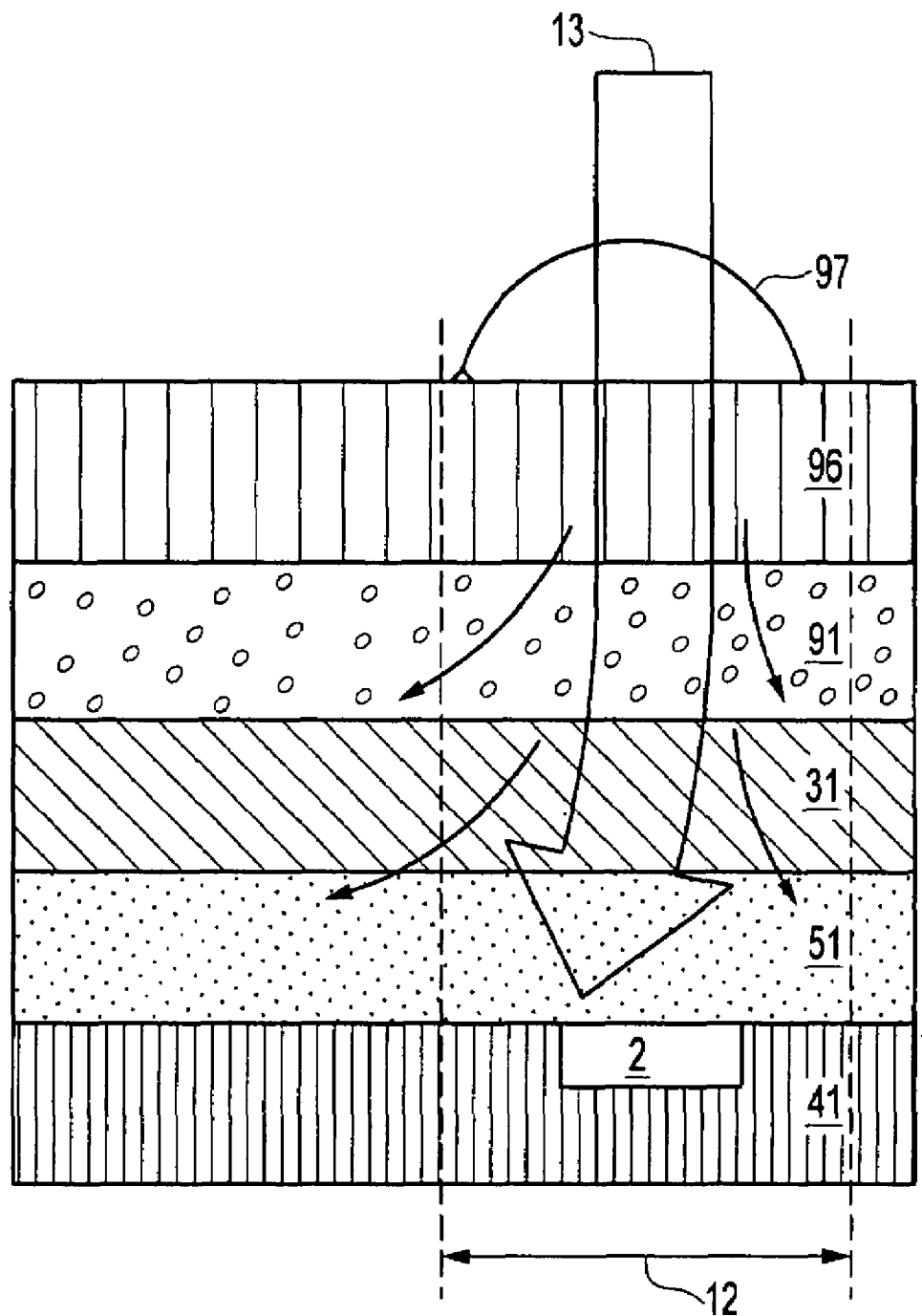
FIG. 2 is a cross-section of a prior art backside illuminated wafer.

The resulting stack 5 shown in FIG. 9 has a shorter distance between the pixel 20 and the microlens 100 than the distance between the pixel 2 and microlens 97 of the conventional frontside illuminated imager shown in FIG. 2. The stack 5 thus provides a shorter path for incident light to travel to the pixel 20 since the substrate layer 40 has been etched away. Therefore, quantum efficiency of the device is enhanced and incident light is more likely to stay within the optical path of the photosensor of pixel 20. In addition, since the silicon layers are thinner, there is less space and less opportunity for the migration of photogenerated electrons and associated electrical crosstalk between pixel 20 and adjacent pixels. Another advantage to the stack 5 is that the interconnect wafer 70 may be part of a wafer which is already connected to a wafer containing the device layer 10, which allows for wafer level packaging, and hence, smaller package size.

Figure 10:
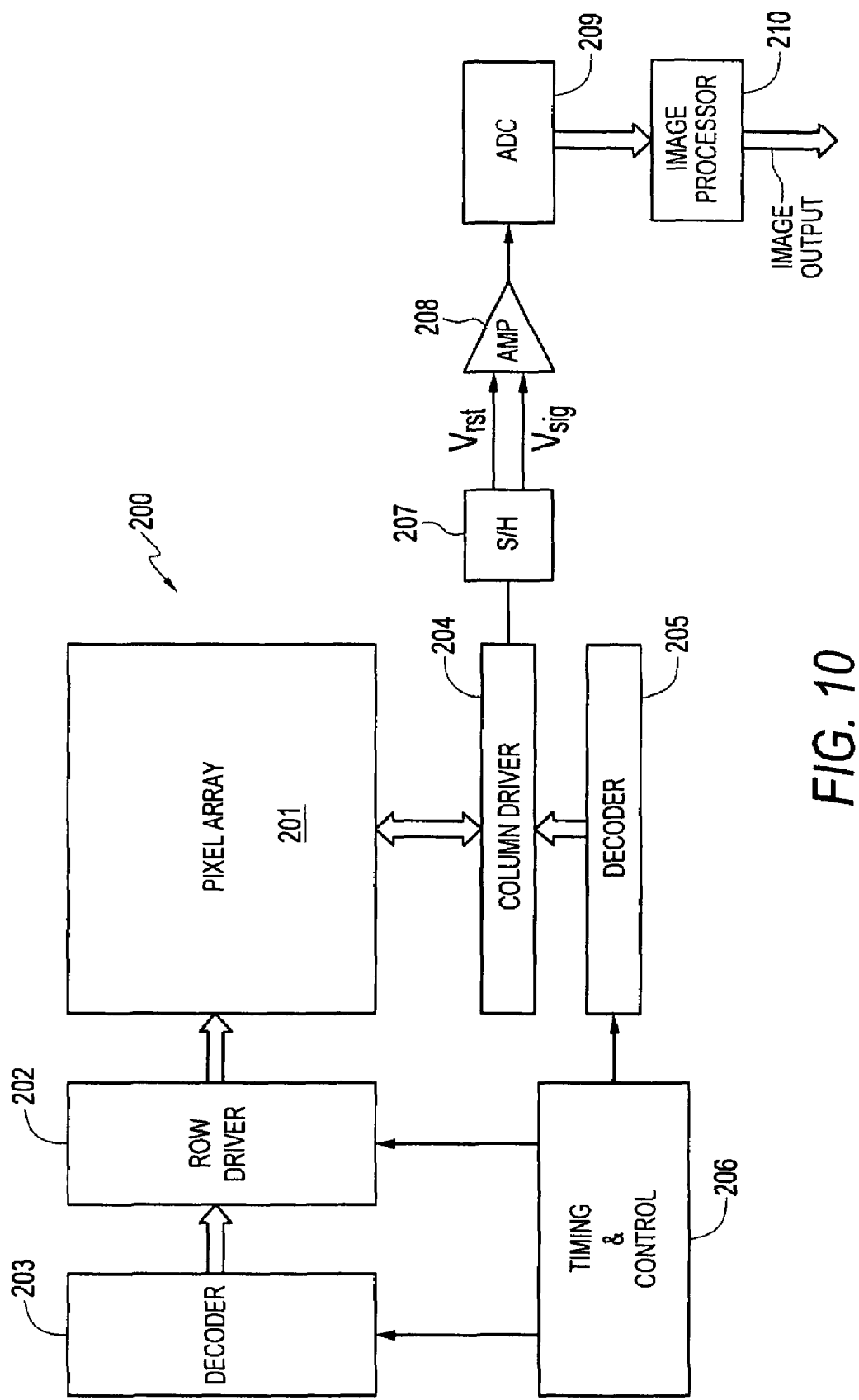
FIG. 10 is a block diagram of an imager employing the embodiment of FIG. 9.

FIG. 10 illustrates a simplified block diagram of an imager 200, for example a CMOS imager, employing a wafer structure having a layer of backside illuminated pixels constructed as described. Pixel array 201 comprises a plurality of pixels containing respective photosensors in a wafer, such as stack 5 of FIG. 9, arranged in a predetermined number of columns and rows. The row lines are selectively activated by the row driver 202 in response to row address decoder 203 and the column select lines are selectively activated by the column driver 204 in response to column address decoder 205. Thus, a row and column address is provided for each pixel. The row and column lines may be formed in the ILD layer 50 of FIG. 9.

The CMOS imager 200 is operated by a timing and control circuit 206, which controls decoders 203, 205 for selecting the appropriate row and column lines for pixel readout, and row and column driver circuitry 202, 204, which apply driving voltages to the drive transistors of the selected row and column lines. The pixel signals, which typically include a pixel reset signal Vrst and a pixel image signal Vsig for each pixel are sampled by sample and hold circuitry 207 associated with the column driver 204. A differential signal Vrst−Vsig is produced for each pixel, which is amplified by an amplifier 208 and digitized by analog-to-digital converter 209. The analog to digital converter 209 converts the analog pixel signals to digital signals, which are fed to an image processor 210 which forms a digital image.

Figure 11:
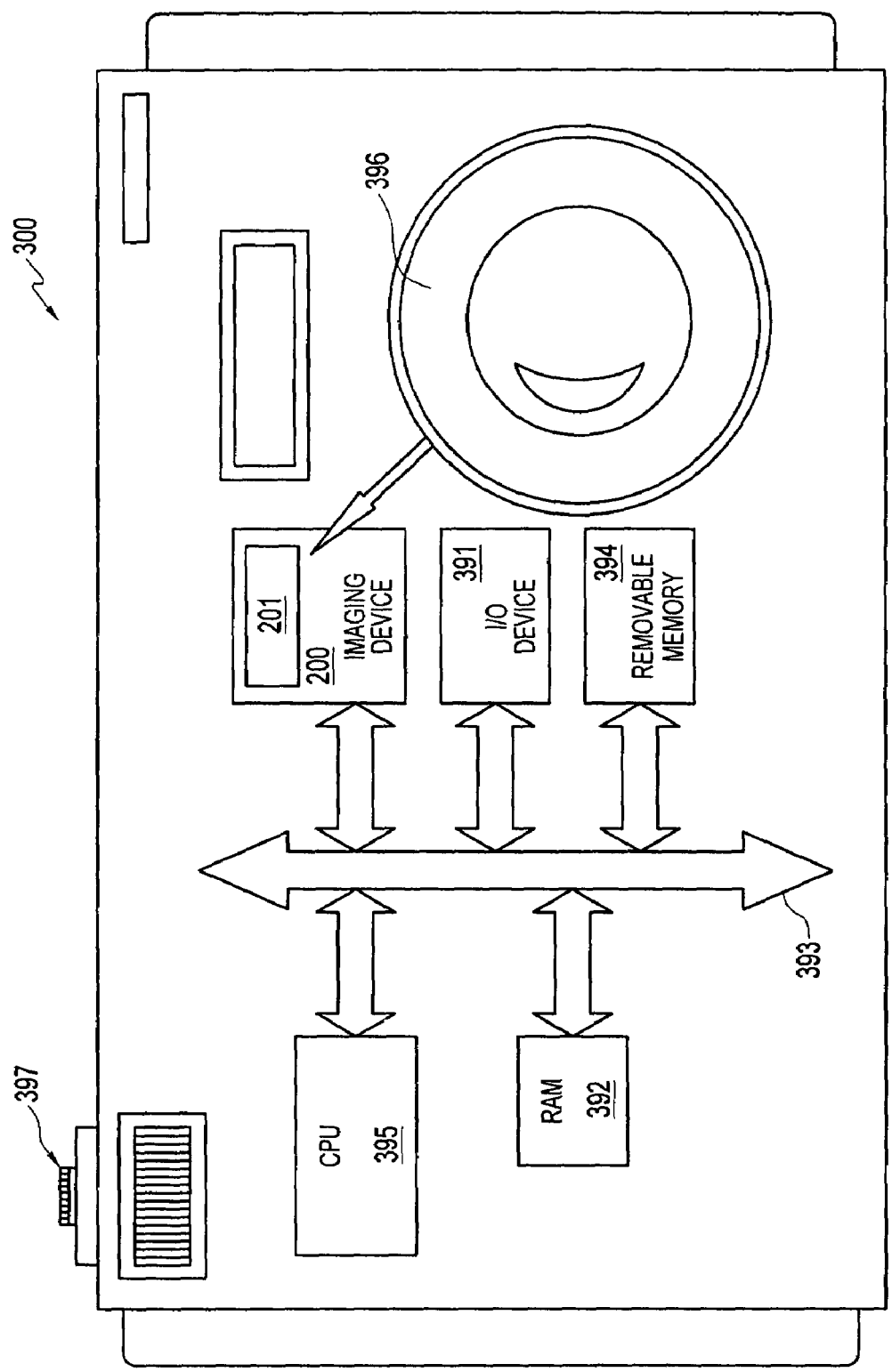
FIG. 11 is a block diagram of a processor system employing the imager of FIG. 10.

FIG. 11 shows in simplified form a typical processor system 300, such as a digital camera, which includes an imaging device 200 (FIG. 10) employing a pixel array on a wafer stack constructed as described above. The processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300, for example a digital still or video camera system, generally comprises a lens 396 for focusing an image on pixel array 201 when a shutter release button 397 is pressed, central processing unit (CPU) 395, such as a microprocessor which controls camera and one or more image flow functions, which communicates with one or more input/output (I/O) devices 391 over a bus 393. Imaging device 200 also communicates with the CPU 395 over bus 393. The system 300 also includes random access memory (RAM) 392 and can include removable memory 394, such as flash memory, which also communicates with CPU 395 over the bus 393. Imaging device 200 may be combined with the CPU, with or without memory storage on a single integrated circuit or on a different chip. Although bus 393 is illustrated as a single bus, it may be one or more busses or bridges or other communication paths used to interconnect the system components.

While an embodiment has been described and illustrated above, it should be understood that it has been presented by way of example, and not limitation. For example, although the embodiment has been described and illustrated in conjunction with imager device wafers and a pixel array readout circuit associated with CMOS imagers, it is not so limited and may be employed with any solid state imager having a pixel array and an associated pixel array readout circuit. Furthermore, the embodiment is not limited to imaging devices and may be employed with any silicon wafer photosensitive device including an interconnect layer. In addition, although interconnect wafer 70 has been described as containing conductive interconnect structures, it may also include passive devices such as capacitors and inductors, and active devices such as transistors and diodes. It will be apparent that various changes in form and detail can be made to the described embodiment.

What is claimed as new and desired to be protected by Letters Patent of the United States is:

1. A method of fabricating an imager comprising:
    forming an imaging device on a device layer having a device side and a substrate side;
    arranging a metallization layer adjacent to the device side of the device layer;
    arranging a plurality of conductive bond pads on the metallization layer;
    adhering a first surface of an interconnect wafer to the metallization layer such that the conductive bond pads are arranged between the first surface of the interconnect wafer and the metallization layer;
    forming a plurality of openings in the interconnect wafer to expose the conductive bond pads;
    forming a plurality of conductive plugs in the plurality of openings;
    etching away at least a portion of the substrate side from the device layer; and
    providing at least a first layer on the substrate side of the device layer.

2. The method of claim 1, wherein the device layer comprises a silicon-on-insulator material.

3. The method of claim 1, wherein the device layer further comprises a buried oxide layer between the substrate side and the device side.

4. The method of claim 3, wherein the etching step comprises etching away the substrate side until the buried oxide layer is exposed.

5. The method of claim 1 further comprising forming the plurality of openings in the interconnect wafer to expose the conductive bond pads either before or after the step of adhering the interconnect wafer to the device layer.

6. The method of claim 3, wherein the first layering step comprises forming a protective layer over the exposed buried oxide layer.

7. The method of claim 6, wherein the first layering step comprises providing a color filter array layer over the protective layer.

8. The method of claim 7, wherein the first layering step further comprises providing a lens layer over the color filter array layer.

9. The method of claim 1 further comprising forming a hardcoat over at least one of the device layer and the interconnect wafer.

10. The method of claim 1, wherein the device layer and the interconnect wafers are each part of a separate wafer.

11. A method of forming an imager comprising:
    forming an imaging device on a first side of a silicon-on-insulator device layer;
    arranging a metallization layer adjacent to the first side of the device layer;
    arranging a plurality of conductive bond pads on the metallization layer;
    adhering a first surface of an interconnect wafer to the metallization layer such that the conductive bond pads are arranged between the first surface of the interconnect wafer and the metallization layer;
    forming a plurality of openings in the interconnect wafer to expose the conductive bond pads;
    forming a plurality of conductive plugs in the plurality of openings;
    removing a portion of a second side of the device layer; and
    providing additional layers over the first side of the device layer.

12. The method of claim 11 further comprising forming a buried oxide layer between the first side and the second side of the device layer.

13. The method of claim 11, wherein the adhering step comprises screen printing an epoxy on the first surface of the interconnect wafer and adhering the interconnect wafer to the device layer.

14. The method of claim 11, wherein the adhering step comprises one of low temperature silicon, anodic, or eutectic bonding.

15. The method of claim 11, wherein said removing step comprises either performing a wet etch or an isotropic dry etch.

16. The method of claim 11, wherein the step of forming a plurality of openings in the interconnect wafer comprises performing an anisotropic or laser etch and stopping on the metallization layer.

17. A method of fabricating a camera, the method comprising:
    providing an image processor;
    providing an imaging device on a device layer having a device side and a substrate side;
    forming a pixel array on the device side of the device layer;
    arranging a metallization layer adjacent to the device side of the device layer;
    arranging a plurality of conductive bond pads on the metallization layer;
    adhering a first side of an interconnect wafer to the metallization layer arranged between the first side of the interconnect wafer and the layer;
    forming a plurality of openings in the interconnect wafer to expose the conductive bond pads;
    forming a plurality of conductive plugs in the plurality of openings;
    etching away at least a portion of the substrate side from the device layer;
    providing at least a first layer on the substrate side of the device layer; and
    electrically connecting the imaging device to the image processor.

18. The method of claim 1, wherein the metallization layer comprises a plurality of metal pads.

19. The method of claim 11, wherein the metallization layer comprises a plurality of metal pads.

20. The method of claim 17, wherein the device layer comprises a silicon-on-insulator material.

21. The method of claim 17, wherein the device layer further comprises a buried oxide layer between the substrate side and the device side.

22. The method of claim 21, where in the etching step comprises etching away the substrate side until the buried oxide layer is exposed.

23. The method of claim 17, further comprising patterning a second surface of the interconnect wafer to expose the metallization layer.

24. The method of claim 21, wherein the first layering step comprises forming a protective layer over the exposed buried oxide layer.

25. The method of claim 24, wherein the first layering step comprises providing a color filter array layer over the protective layer.

26. The method of claim 25, wherein the first layering step further comprises providing a lens layer over the color filter array layer.

27. The method of claim 17, further comprising forming a hardcoat over at least one of the device layer and the interconnect wafer.

28. The method of claim 17, wherein the device layer and the interconnect wafers are each part of a separate wafer.

29. The method of claim 17, wherein the metallization layer comprises a plurality of metal pads.

30. The method of claim 29, further comprising patterning the interconnect wafer to form a plurality of via openings aligned with the plurality of metal pads.

31. The method of claim 30, further comprising forming a plurality of conductive plugs in the plurality of via openings.

* * * * *